Figure 1:
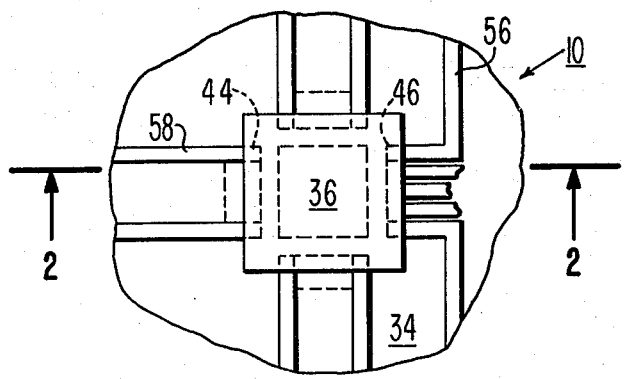

United States Patent [19]

Schelhorn

[11] 4,383,270
[45] May 10, 1983

[54] STRUCTURE FOR MOUNTING A SEMICONDUCTOR CHIP TO A METAL CORE SUBSTRATE

[75] Inventor: Robert L. Schelhorn, Cinnaminson, N.J.

[73] Assignee: RCA Corporation, New York, N.Y.

[21] Appl. No.: 167,367

[22] Filed: Jul. 10, 1980

[51] Int. Cl.³ .................... H01L 23/48; H01L 23/02; H01L 23/48
[52] U.S. Cl. ..................................... 357/71; 357/81; 357/65
[58] Field of Search ....................... 357/81, 65, 74, 71

[56] References Cited

U.S. PATENT DOCUMENTS

| | | | |
|---|---|---|---|
| 2,984,077 | 5/1961 | Gaskill | 357/81 |
| 3,597,834 | 8/1971 | Lathrop et al. | 357/71 |
| 3,745,487 | 7/1973 | Milard et al. | 333/33 |
| 3,753,056 | 8/1973 | Cooke | 357/74 |
| 3,784,884 | 1/1974 | Zoroglo | 357/74 |
| 3,808,474 | 4/1974 | Cooke et al. | 357/74 |
| 4,135,168 | 1/1979 | Wade | 331/108 R |

Primary Examiner—Andrew J. James
Assistant Examiner—E. D. Burnside
Attorney, Agent, or Firm—Joseph S. Tripoli; Robert L. Troike; William Squire

[57] ABSTRACT

A porcelain coated steel substrate for receiving thick film printed circuit thereon includes thermally and electrically conductive pedestals which are in thermal and electrical contact with the steel core. The pedestal surface is coplanar with the porcelain coating so that a substantially continuous plane surface is present. This permits semiconductor chips readily to be mounted on the substrate, the pedestals serving as heat and electrical conductors to the substrate, and serves also to facilitate the deposition of thick film elements.

6 Claims, 3 Drawing Figures

STRUCTURE FOR MOUNTING A SEMICONDUCTOR CHIP TO A METAL CORE SUBSTRATE

The present invention relates to an improved structure for securing integrated circuit chips to a metal core substrate for improved heat dissipation.

Microcircuits implemented with thick film are in wide commercial use. A typical such circuit may include an insulating ceramic substrate, such as one formed of alumina or beryllia, circuit elements such as resistors, transistors, and integrated circuits on the substrate, and thick film circuit paths deposited on the substrate by silk screening or other techniques interconnecting these elements. The resistors and certain other of the elements may themselves be deposited by silk screening techniques.

There are a number of disadvantages inherent in the approach to microcircuit fabrication as discussed above. Beryllia substrate material is available only in small sizes and is relatively expensive. Alumina substrate material, on the other hand, has relatively high thermal resistance when compared to metals. As a result, in high power loads which require dissipation of relatively large amounts of heat, neither beryllia nor alumina ceramic substrates are found to be completely satisfactory.

One can employ, rather than a ceramic substrate, one formed of a porcelainized metal core. Such a substrate is fabricated by coating a low carbon steel with an electrically insulating coating of porcelain. The porcelain is fired at high temperatures to form a relatively hard, permanent electrical insulator. The thick film circuits are then deposited in the usual manner on top of the porcelain coating. The metal core substrate has a low thermal conductivity; however, the porcelain coating has a relatively high thermal resistance. This is a disadvantage in applications where the circuit generates a substantial amount of heat which it is desired to conduct away.

Some prior art systems for providing heat sinks for microcircuit chips on beryllia substrates employ pedestals secured to the substrate. However, in a thick film process such pedestals tend to interfere with the silk screen deposition steps and generally do not lend themselves to a general purpose thick film circuit deposited on a porcelainized metal core substrate because thick film circuits require extremely flat surfaces.

In accordance with an embodiment of the present invention a semiconductor microcircuit chip mounting structure comprises a sheet material core of thermally conductive material, the sheet having a first plane surface. A raised pedestal is on the first surface and comprises a thermally and electrically conductive material terminating in a plane second surface. The second surface is parallel to the first surface. A thermally and electrically insulating layer is on the first surface coextensive and parallel with the second surface. As a result, plane components can be placed over the second surface of the raised pedestal which is coplanar with the outer surface of the insulating layer.

Figure 2:
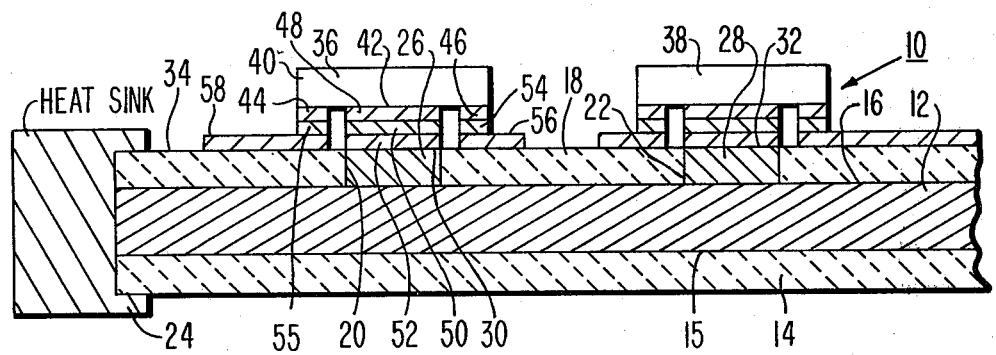
Figure 3:
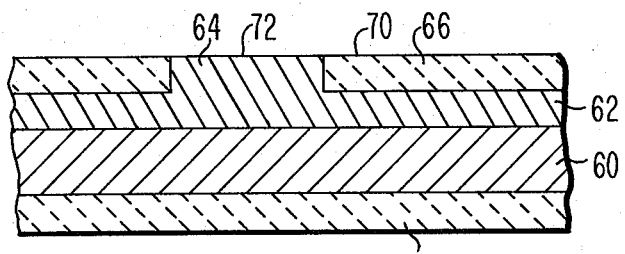

In the drawing:

FIG. 1 is a plan view of a portion of a porcelainized metal core substrate and a microcircuit chip mounted thereon embodying the invention, FIG. 2 is a sectional view of the embodiment of FIG. 1, taken along lines 2—2, and FIG. 3 is a sectional view through a second embodiment of the invention.

In FIGS. 1 and 2, the porcelainized coated metal core substrate 10 is formed with a low carbon steel sheet metal core 12. The core 12 has a layer of thermal and electrically insulating porcelain 14 over its lower surface 15. The upper surface 16 of the core is coated with a layer of porcelain 18 which is formed with spaced openings 20 and 22. A heat sink 24 which may be a suitable block or finned structure made of thermally conductive metal is thermally coupled to one end of the core 12.

Copper pedestals 26 and 28, respectively, are located within openings 20 and 22 in the core. The pedestals 26 and 28 are in thermal and electrical conductive contact with core 12 and may be formed by electroplating or other method. The upper surfaces 30 of pedestal 26 and 32 of pedestal 28 are plane surfaces which are coplanar with the upper surface 34 of the porcelain 18. Surfaces 30, 32 and 34 lie in a continuous, single plane. This makes it easy to deposit thick film circuit components directly onto the pedestals 26 and 28 using conventional silk screening techniques or to mount microcircuit chips such as chips 36 and 38 onto the substrate 10.

Chips 36 and 38, which may be identical in their mounting connections to the substrate 10, are of the leadless type. That is, electrical insulating case 40 of chip 36 has a lower plane surface 42 to which are mounted copper circuit electrodes 44 and 46, among others. Prior art thick film circuits do not provide a means for heat sinking chips such as chips 36 and 38 directly to the core 12, but rather require external heat sink devices. These external devices are relatively costly and are inefficient.

Device 36 has a centrally located copper heat sink pad 48 mounted coplanar with the copper electrodes 44 and 46. This pad may be square. The pad 48 and electrodes 44 and 46 are manufactured as part of and are included with the chip 36. These electrodes are relatively thin, e.g. $60\mu$ inches thick. A layer of solder 50 is deposited over the copper pad 48. This layer is a relatively thin layer, several mils, which is deposited by conventional means, such as by solder dipping in a wave solder system. A layer of solder 52 is deposited over the pedestal 26. At the same time, layers of solder 54, 55 are deposited over the thick film circuit conductors 56 and 58, respectively, at the location of the electrodes 44 and 46. These layers 54, 55 may be silk screened or otherwise printed over the sink screened conductors 54 and the pedestal 26. The combined layers of solder 50 and 52, shown as separate layers here, after reflow, form a single layer of solder 2-5 mils thick. In the alternative, the electrodes 44, 46 may also be coated with solder at the same time as pad 48. The conductors 54, 46 are usually in the order of about 200-300$\mu$ inches thick. The various thicknesses in the drawing are exaggerated for clarity of illustration. When the solder layers 54, 55, 50 and 52 are reflowed to join the chip electrodes and pad to the corresponding circuit conductors the solder melts and flows over the conductor surfaces. The chip electrodes 44, 46 and pad 48 thus "float" over the melted solder and excess solder can form fillets (not shown) at the edges of the electrodes. Therefore it does not matter which electrodes or pads on the chip are initially coated with solder. In any event the relatively thicker solder layers more than compensate for differences in thickness of the much thinner electrodes and conductors which in essence, for this purpose, are substantially coplanar. It is this coplanar relationship which simplifies the assembly of the chip to the circuit conductors and pad.

To achieve the above assembly, the chip 36 is secured to the substrate 10 by placing it over the appropriate location of the printed circuit conductors 56, 58 and the pedestal 26. All chips are so placed at one time. Then the entire assembly is placed in a vapor phase soldering system for reflowing the solder and securing the appropriate circuit conductors to the contacts of each of the chips and for securing the pedestal 26 in thermal and electrical contact to the copper pad 48 of each chip. This structure provides a thermal heat sink via the core 12 and heat sink 24, as well as a ground plane for electrical components if such is desired.

When the core 12 is made out of Kovar, a commercially available steel alloy which has a thermal coefficient expansion which closely matches that of the microcircuit chip 36, the relatively ductile copper pedestal 26 which has a coefficient of thermal expansion different than Kovar, is limited in its expansion to that of the relatively stronger Kovar core 12 and therefore provides a thermal coefficient of expansion which closely matches that of the chip 36. It is to be understood that the chip 36 represents a complete sealed microcircuit package and is commercially available. The copper pedestal 26 may have a thickness in one embodiment in the range of about 3–10 mils while the Kovar steel core may have a thickness of about 30 mils.

The substrate structure of FIGS. 1 and 2 provides a relatively good thermal conductor between the pad 48 on the chip 36 and the core 12. At the same time the pedestal 26 surface 30, being coplanar with the surface 34 of porcelain 18, does not interfere with the deposition of the printed circuit conductors and thick film components on porcelain 18. The surface of porcelain 18 must be plane to a critical degree for the purpose of depositing the thin conductors thereon. Any non-plane condition would change the thickness of such conductors and be detrimental to the circuit. In silk screening, the screen must be uniformly spaced from the substrate. Any non-uniformity of the substrate surface will vary this spacing. The conductors so deposited will have a thickness determined by this spacing and will therefore be non-uniform also. The heat sink device 24 represents a large mass and it may be an additional object secured to the substrate or in the alternative may be the mounting for the substrate 10 which is in a heat conductive relationship with the core 12.

The structure of FIG. 2 may be fabricated as follows. The raised pedestals of copper forming pedestals such as 26 and 28 can be electroplated copper deposited in a pattern utilizing a photoresist mask. In the alternative, the pedestals may be laminated to the core 12 at the appropriate locations, or the metal core 12 may be machined to form the pedestals 26 and 28 but this could be expensive. Once the core 12 and the pedestals are formed, the mesas of the pedestals are covered with resist material such as plater's tape or phororesist. The entire metal core board is then subjected to a first step of the porcelainizing process which comprises coating and then drying the porcelain material. This step can be accomplished by dipping, spraying, or electrophesis. Once the coating is dried, the masking material is removed from the mesas of the pedestals. The metal core is then fired at an elevated temperature and the porcelain flows providing a level coating which is flush with the top of the pedestals. The actual thickness of the porcelain and the height of the pedestals can be determined for each implementation. A completed metal core now has a relatively continuous flat surface with exposed metal heat sink pads attached directly to the metal core board.

A circuit pattern is then printed onto this surface, for example, by silk screening, and, during the printing of the conductor patterns or some other convenient step, thick film metal pads, e.g., copper, may be screen printed onto the mesa location. After the entire thick film circuit is fabricated, the final assembly of the heat generating devices is completed. To facilitate this, the pedestals, circuit pattern and the electrical and thermal pads on the devices are located to allow appropriate electrical contact to the electrodes on the substrate.

An alternative construction is provided in FIG. 3. Here a metal core 60 is coated with a thin layer of copper 62 and a raised pedestal of copper 64 is formed. The pedestal may be formed by first depositing the layer 62 of the given thickness over the substrate and then masking with a suitable photoresist a portion of the layer to expose an area comprising the area of pedestal 64. Then the copper is further plated until the desired thickness of the pedestal 64 is reached. Later, both sides of the core 60 and copper layer 62 are coated with porcelain 66 and 68 and fired as described above. The surface 70 of the porcelain 66 is flush with the surface 72 of the pedestal 64.

The layer of copper 62 provides a good RF shield for high frequency RF circuits. The layer of copper 62 shields the steel core 60 from RF energy and reduces considerably the magnetic effect of the steel core which would otherwise be exposed to high frequency electrical signals. This reduces electrical losses relative to those which may occur without the copper layer 62. The copper layer 62 being integral with the pedestal 64 and directly thermally connected to the core 60, provides both thermal and electrical connection between the device connected to the pedestal 64 and the core 60.

What is claimed is:

1. A thermally and electrically conductive mounting for a semiconductor chip on a substrate comprising:
    a thermally and electrically conductive substrate having a substantially plane surface;
    a raised thermally and electrically conductive pedestal on said substrate having a surface spaced from and substantially parallel to said plane surface, said semiconductor chip being mounted on said pedestal, said pedestal being in electrical and thermal contact with said plane surface; and
    an electrically insulating porcelain layer on said plane surface having an outer surface substantially coplanar with said surface of said pedestal, said porcelain layer abutting said pedestal and forming with said pedestal a continuous plane surface.

2. The mounting set forth in claim 1 further including heat sink means thermally conductively coupled to said substrate.

3. The mounting set forth in claim 1 wherein said substrate is a low carbon steel and said pedestal is copper.

4. The mounting set forth in claim 1 further including a plurality of conductors on said layer terminating adjacent to said pedestal and a plurality of solder layers on portions of said conductors adjacent to said pedestal and on said pedestal, each said solder layers having about the same thickness.

5. The structure of claim 1 wherein said substrate is a magnetic metal, said structure further including a layer of non-magnetic metal material over said substrate in thermal and electrical contact with said pedestal, said insulating layer being over said non-magnetic layer.

6. The structure of claim 5 wherein said layer of non-magnetic material and pedestal are copper, said pedestal being on said non-magnetic layer.

* * * * *